(12) United States Patent
Peschke

(10) Patent No.: US 7,948,250 B2
(45) Date of Patent: May 24, 2011

(54) PROBE WITH A CHANGING DEVICE

(75) Inventor: Martin Peschke, München (DE)

(73) Assignee: Rohde & Schwarz GmbH & Co. KG, München (DE)

( * ) Notice: Subject to any disclaimer, the term of this patent is extended or adjusted under 35 U.S.C. 154(b) by 136 days.

(21) Appl. No.: 12/065,070

(22) PCT Filed: Sep. 27, 2006

(86) PCT No.: PCT/EP2006/009389
§ 371 (c)(1),
(2), (4) Date: Apr. 15, 2008

(87) PCT Pub. No.: WO2007/039204
PCT Pub. Date: Apr. 12, 2007

(65) Prior Publication Data
US 2008/0238409 A1    Oct. 2, 2008

(30) Foreign Application Priority Data
Oct. 4, 2005   (DE) .......................... 10 2005 047 483

(51) Int. Cl.
*G01R 27/26* (2006.01)
*G01R 27/08* (2006.01)
*G01R 31/02* (2006.01)

(52) U.S. Cl. ........ 324/724; 324/690; 324/715; 324/72.5

(58) Field of Classification Search ................. 324/724, 324/754, 72.5, 690, 715
See application file for complete search history.

(56) References Cited

U.S. PATENT DOCUMENTS

| | | | | |
|---|---|---|---|---|
| 4,209,742 | A | | 6/1980 | Bender et al. |
| 4,721,903 | A | | 1/1988 | Harsch et al. |
| 5,107,201 | A | * | 4/1992 | Ogle ............................. 324/72.5 |
| 5,448,162 | A | | 9/1995 | Beha et al. |
| 5,469,064 | A | * | 11/1995 | Kerschner et al. ............ 324/537 |
| 5,488,313 | A | | 1/1996 | Gourse et al. |
| 5,903,143 | A | * | 5/1999 | Mochizuki et al. .......... 324/72.5 |
| 6,118,287 | A | | 9/2000 | Boll et al. |
| 6,191,594 | B1 | | 2/2001 | Nightingale et al. |
| 6,307,363 | B1 | * | 10/2001 | Anderson .................... 324/72.5 |
| 6,366,103 | B1 | | 4/2002 | Cheng |
| 6,400,167 | B1 | | 6/2002 | Gessford et al. |
| 6,404,215 | B1 | | 6/2002 | Nightingale et al. |
| 6,466,000 | B1 | * | 10/2002 | Nightingale ................. 324/72.5 |
| 2003/0195713 | A1 | | 10/2003 | McTigue |

FOREIGN PATENT DOCUMENTS

| | | |
|---|---|---|
| DE | 43 19 643 | 1/1995 |
| DE | 44 17 580 | 3/1995 |
| EP | 1 160 575 | 12/2001 |
| GB | 2 282 230 | 3/1995 |
| GB | 2 316 534 | 2/1998 |

* cited by examiner

*Primary Examiner* — Timothy J Dole
*Assistant Examiner* — Farhana Hoque
(74) *Attorney, Agent, or Firm* — Marshall, Gerstein & Borun LLP

(57) ABSTRACT

The invention concerns a probe with at least two test prods, which are provided on a changing device connected to the probe and which can be alternately connected to an electric waveguide running inside the probe.

20 Claims, 3 Drawing Sheets

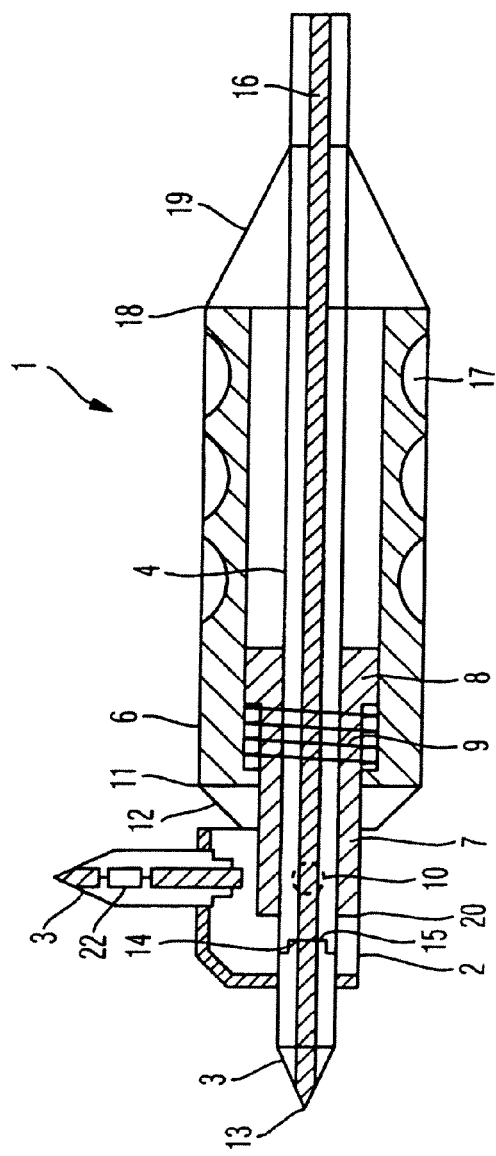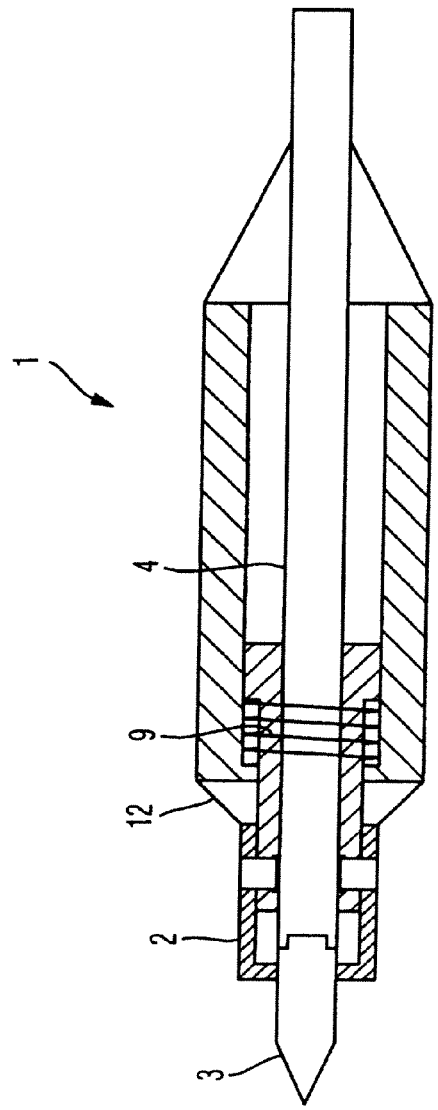
Fig. 1
Fig. 2

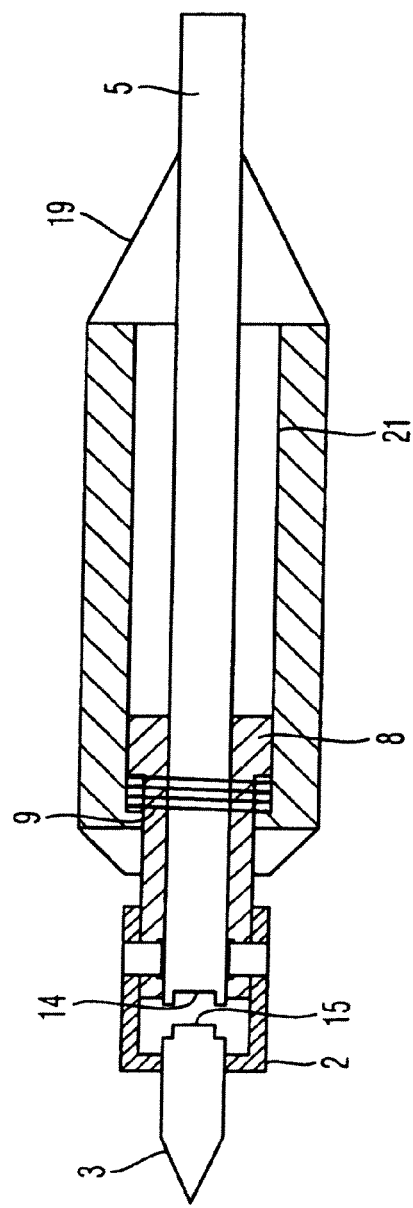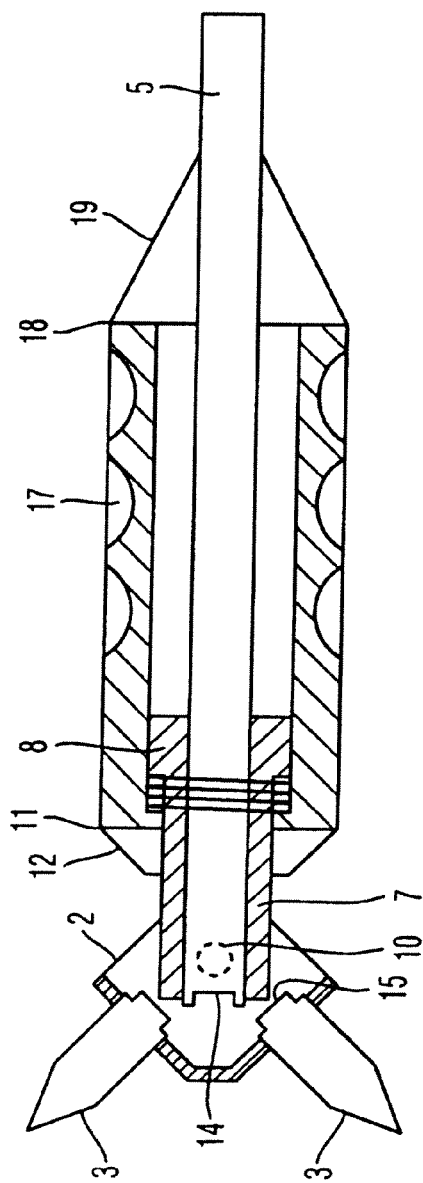

PROBE WITH A CHANGING DEVICE

BACKGROUND OF THE INVENTION

1. Field of the Invention

The present invention relates to a probe with a switchover device for a measuring instrument, in particular, an oscilloscope.

2. Related Technology

Voltage probes for oscilloscopes are available in a range of variants. Active probes are used primarily for high-frequency signals beyond 1 GHz; whereas passive waveguide probes provide a cost-favourable alternative. In the case of passive-waveguide probes, the measuring tip is connected directly to the waveguide, which is terminated with 50Ω, so that the circuit to be measured is loaded on the basis of the low impedance of 50Ω.

A high-voltage probe, which provides a high-frequency coaxial cable, which is closed by its surge impedance over the majority of the high-frequency range, is known from DE 41 40 506 A1. Moreover, the high-voltage probe described in DE 41 40 506 A1 comprises a circuit with resistors and capacitors, which provide a fixed division ratio independently of the input frequency. The exemplary embodiments described in DE 41 40 506 A1 l cover an overall measurement range from 0 Hz (direct current) to more than 100 MHz (high-frequency), this range being subdivided into four individual measurement ranges, so that each exemplary embodiment covers a given frequency range. The disadvantage in this context is that, when measuring a frequency range, which extends from direct current (0 Hz) up to high-frequency alternating currents of more than 100 MHz, the high-voltage probe must be changed several times. Furthermore, it is disadvantageous that the high-voltage probes described in DE 41 40 506 A1 are designed to measure voltages within the range of several tens of thousands of volts because of the high-voltage balancing ratio. A connected voltage of approximately 1 volt would no longer be registered with adequate precision by these high-voltage probes.

SUMMARY OF THE INVENTION

The invention therefore provides a probe, which covers a broad frequency range, wherein the voltage range to be registered can be expanded and/or reduced rapidly and flexibly during the measurement, so that a broad frequency range and also a broad voltage range can be measured using one probe.

Accordingly, the invention provides probe with at least two probe tips disposed on a switchover device connected to the probe, which can be connected alternately to an electrical wavequide extending within the probe.

One advantage of the probe according to the invention is that the probe comprises at least two probe tips, which are fitted in a switchover device connected to the probe. The probe tips can be connected alternately to an electrical waveguide extending within the probe, so that voltages close to a measuring-range threshold can be investigated conveniently and without a complete replacement of the probe tips.

A further advantage in one further development of the probe according to the invention is that the electrical waveguide is a coaxial cable, thereby guaranteeing that the probe according to the invention can register a broad frequency range at the measuring tip.

It is also advantageous that the probe according to the invention provides a simple structure and is robust with regard to voltage overloads, temperature fluctuations and mechanical stress.

Another advantage of the probe according to the invention is that the circuit to be measured is subjected to reduced loading because of the voltage divider provided in the probe tips. This increases the accuracy of measurement.

Furthermore, it is advantageous that the series resistors no longer need to be plugged on manually, because they are already integrated in the probe tips provided in the switchover device.

If identification resistors, which are connected via an identification line to the input of the measuring instrument, are provided in the probe tips of the probe according to the invention, it is advantageous to the user that the display values on the measuring instrument do not need to be corrected manually whenever the probe tips are changed. The displayed values are automatically scaled, because the value of the voltage divider in the currently-used probe tip is communicated to the connected measuring instrument via the identification line.

It is additionally advantageous, that the non-active probe tip, which has been rotated to the side, can now be used as a support point for the user's fingers. Moreover, the probe tips not in use do not obstruct adaptation of the active probe tip.

BRIEF DESCRIPTION OF THE DRAWINGS

One exemplary embodiment of the invention is described in greater detail below with reference to the drawings. The drawings are as follows:

FIG. 1 shows a section through a probe according to the invention;

FIG. 2 shows a section through a probe according to the invention with the probe tip in the contacted condition;

FIG. 3 shows a section through a probe according to the invention with the probe tip in the non-contacted condition;

FIG. 4 shows a section illustrating a switchover process of the probe tips in a probe according to the invention;

DETAILED DESCRIPTION

Figure 5:
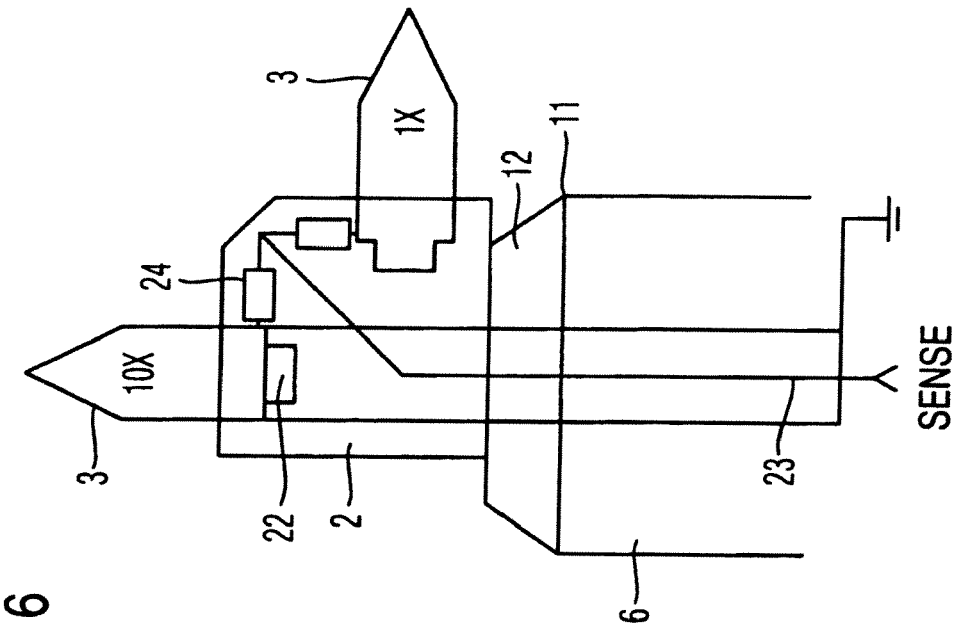
FIG. 5 shows a schematic presentation of an exemplary embodiment of a probe according to the invention with one probe tip in the contacted condition.

FIG. 1 shows a section through a probe 1 according to the invention, which can be connected to a measuring instrument, for example, an oscilloscope or a network analyser. The probe 1 according to the invention provides at least two probe tips 3, which are disposed in a switchover device 2 connected to the probe 1. These probe tips 3 can be connected alternately to an electrical waveguide 4, in particular, a coaxial cable 5 extending within the probe 1.

The probe 1 according to the invention provides a probe element 6 made of a non-conductive material, preferably a synthetic material, in which radial grooves 17, which are intended to prevent the user's hand from slipping during manual operation of the probe 1, are formed.

The interior of the probe element 6 provides a cylindrical guide 21. A sleeve 7 can be displaced axially along the cylindrical guide 21, wherein this sleeve 7 encloses a part of the waveguide 4 extending within the interior of the probe 1. The sleeve 7, which projects from the probe element 6 at a first end 11 of the latter, provides a flange 8 disposed in the interior of the probe element 6. A spring 9, which surrounds the sleeve 7 in a concentric manner, is supported against this flange 8. In a locked condition, the tensile force of the spring 9 causes the switchover device 2 to be in contact with a first cap 12 fitted to a first end 11 of the probe element 6. A second cap 19, which protects the cylindrical guide 21 in the interior of the probe element 6 from contamination, is fitted to a second end 18 of the probe element 6, which faces towards the measuring instrument to be connected.

The probe 1 according to the invention provides a replaceable switchover device 2, which can be rotated about an axis 10 within an end of the sleeve 7 enclosing the waveguide 4, which projects from the probe element 6. The fitted probe tips 3, which are screwed into the switchover device 2, are also replaceable.

The switchover device 2 provides a recess 20, into which the sleeve 7 projecting from the probe element 6 engages, the switchover device 2 being attached at its end projecting from the probe element 6.

At an end facing towards a measuring tip 13, the waveguide 4, which is held within the sleeve 7, provides a recess 14, which acts as a plug contact. The associated plug is provided by a projection 15 on the probe tip 3 formed to complement the recess 14. This projection 15, which surrounds an inner conductor 16 of the coaxial cable 5, is provided at an end of the probe tip 3 facing away from the measuring tip 13. Any known type of high-frequency plug connection, in particular, BMA, SMB, can also be used.

FIG. 2 shows a plan view of a probe 1 according to the invention with a probe tip 3 in the contacted condition, wherein the other probe tips, which are attached to the switchover device 2, are not visible in this view. The contacted probe tip 3 is plug-connected onto the waveguide 4, wherein this plugged contact is subject to the force of the spring 9 disposed in the interior of the cylindrical guide 21.

FIG. 3 shows a plan view of a probe 1 according to the invention with the probe tip 3 in the non-contacted condition. The probe tip 3 is released from the plug contact, which is subject to the tensile force of the spring 9, by pulling against the compressive force of the spring 9. In this condition, the probe tip 3, which has just been in use, can be replaced by a second probe tip 3 fitted to the switchover device 2, by rotating the second probe tip 3 into the correct position and aligning it in such a manner that when the force on the rotatable switchover device 2 is released, the replaced probe tip 3 engages in the contact.

FIG. 4 shows a plan view of the switchover process of the probe tips 3 in a probe 1 according to the invention. Neither of the two probe tips 3 provided on the rotatable switchover device 2 is engaged in the plug connection. An engagement of one of the two probe tips 3 is brought about by rotating the switchover device 2 either further in the anticlockwise direction or further in the clockwise direction.

FIG. 5 shows a schematic presentation of an exemplary embodiment of a probe 1 according to the invention with a probe tip 3 in the contacted condition. Within the switchover device 2 of the probe 1 according to the invention, an identification resistor 24 connected to an identification line 23 is provided for each probe tip 3. The identification resistors 24 are disposed between the identification line 23 and the outer ground conductor of the individual probe tips 3. If the identification line 23 is connected via an additional pin, for example, to an oscilloscope, a switchover of the display scaling of the oscilloscope is implemented automatically when the probe tip 3 is exchanged.

Figure 6:
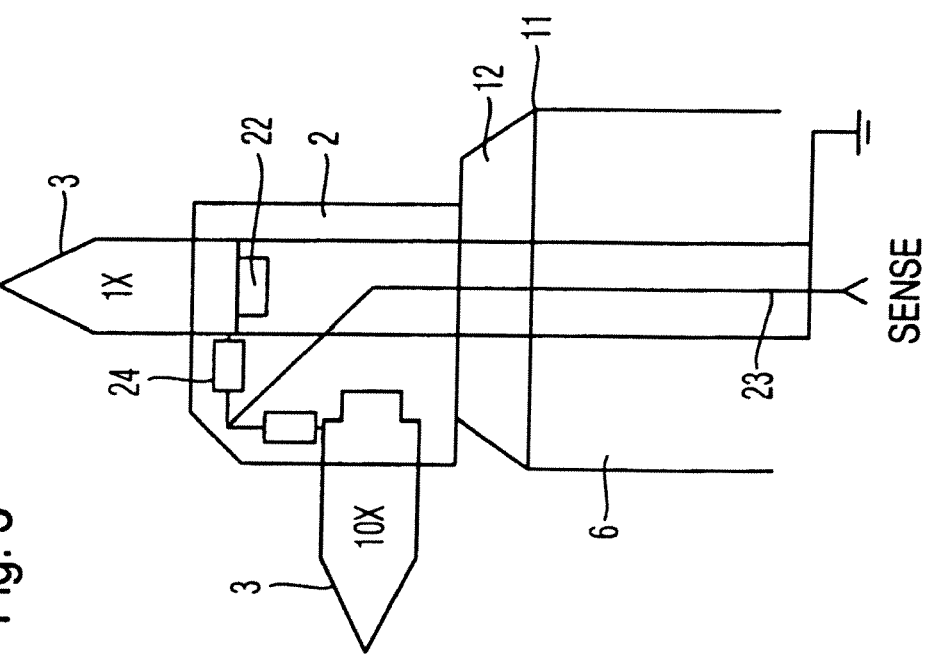
FIG. 6 shows a schematic presentation of an exemplary embodiment of a probe according to the invention with the probe tip for a relatively broad measurement range in the contacting condition.

FIG. 6 shows a schematic presentation of an exemplary embodiment of a probe 1 according to the invention with a probe tip 3 for a relatively-higher voltage range in the contacted condition. The display can now be automatically scaled to the higher voltage range by connecting the input of the measuring device to the identification resistor 24 via the identification line 23. The two probe tips 3 provided in the switchover device 2 differ from one another with reference to a dividing resistor 22 provided within the probe tips, which defines the voltage range to be measured.

The invention is not restricted to the exemplary embodiment illustrated or the exemplary embodiments described and can be used, for example, with an oscilloscope, a signal generator or a network analyser.

The invention claimed is:

1. Probe comprising at least two probe tips disposed in a switchover device connected to the probe, which probe tips can be alternately plug-connected to an electrical waveguide extending within the probe via a plug contact,
    wherein the waveguide is surrounded by a sleeve capable of being displaced within a probe element against a spring, and
    wherein the switchover device can be rotated about an axis while the switchover device is within an end of the sleeve projecting from the probe element,
    wherein the sleeve provides a flange, and
    wherein a spring engages directly against the flange of the sleeve.

2. Probe according to claim 1, wherein the waveguide is a coaxial cable.

3. Probe according to claim 1, wherein the probe tips in the switchover device are replaceable.

4. Probe according to claim 1, wherein the probe tips are screwed into the switchover device.

5. Probe according to claim 1, wherein the switchover device is replaceable.

6. Probe according to claim 1, wherein in a locked condition, the switchover device is disposed in contact with a first cap fitted to a first end of the probe element.

7. Probe according to claim 1, wherein the switchover device provides a recess, into which the sleeve projecting from the probe element engages.

8. Probe according to claim 7, wherein the switchover device is locked by a spring engaging against the sleeve.

9. Probe according to claim 1, wherein the waveguide, which is held in the sleeve, provides a recess at an end facing towards the measuring tip.

10. Probe according to claim 9, wherein at an end facing away from the measuring tip, the probe tips provide a projection formed to complement the recess in the waveguide.

11. Probe according to claim 10, wherein an inner conductor of a coaxial cable extends within the projection.

12. Probe according to claim 1, wherein the probe element provides grooves arranged in a radial manner.

13. Probe according to claim 12, wherein the probe element comprises a non-conductive material.

14. Probe according to claim 12, wherein the probe element provides a second cap at the second end, which faces towards a connected measuring instrument.

15. Probe according to claim 12, wherein the probe element comprises a non-conductive synthetic material.

16. Probe according to claim 1, wherein the probe element provides a guide in its interior.

17. Probe according to claim 16, wherein the sleeve can be displaced in an axial manner along the guide.

18. Probe according to claim 1, wherein a non-active probe tip is provided as a gripping element, wherein the non-active probe tip is not connected to the electrical waveguide.

19. Probe according to claim 1, wherein a dividing resistor is provided within each probe tip.

20. Probe comprising at least two probe tips disposed on a switchover device connected to the probe, which probe tips can be connected alternately to an electrical waveguide extending within the probe,
- wherein at least one non-active probe tip rotated to the side is provided as a support element for a user's fingers, wherein the non-active probe tip is not physically connected to the electrical waveguide,
- an identification element, connected to an identification provided within the switchover device for each probe tip,
- wherein the identification element is a identification resistor, and the voltage falling at the identification resistor is used for the automatic scaling of the measurement display provided on the connected measuring instrument.

* * * * *